United States Patent
Seo et al.

(10) Patent No.: US 9,929,223 B2
(45) Date of Patent: Mar. 27, 2018

(54) ORGANIC LIGHT-EMITTING DIODE DISPLAY

(71) Applicant: Samsung Display Co., Ltd., Yongin-si, Gyeonggi-do (KR)

(72) Inventors: Il Hun Seo, Asan-si (KR); Chul Kyu Kang, Suwon-si (KR); Byoung Ki Kim, Seoul (KR); Young Jun Shin, Seongnam-si (KR); Jae Beom Choi, Suwon-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 23 days.

(21) Appl. No.: 15/147,716

(22) Filed: May 5, 2016

(65) Prior Publication Data
US 2016/0329393 A1 Nov. 10, 2016

(30) Foreign Application Priority Data
May 8, 2015 (KR) .......................... 10-2015-0064617

(51) Int. Cl.
*H01L 29/08* (2006.01)
*H01L 27/32* (2006.01)
(Continued)

(52) U.S. Cl.
CPC ....... *H01L 27/3262* (2013.01); *G09G 3/2022* (2013.01); *G09G 3/3225* (2013.01); *G09G 3/3233* (2013.01); *G09G 3/3266* (2013.01); *G09G 3/3275* (2013.01); *H01L 27/3246* (2013.01); *H01L 27/3276* (2013.01); *G09G 2300/0842* (2013.01); *G09G 2310/027* (2013.01); *G09G 2310/0243* (2013.01);
(Continued)

(58) Field of Classification Search
CPC .. G09G 3/2022; G09G 3/3225; G09G 3/3233; G09G 3/32752; H01L 27/3262; H01L 27/3246; H01L 27/3276
USPC ........................................ 257/40; 345/76–84
See application file for complete search history.

(56) References Cited

U.S. PATENT DOCUMENTS

2004/0251846 A1* 12/2004 Choi .................... G09G 3/3233
315/169.3
2011/0156041 A1* 6/2011 An ........................ H01L 51/003
257/59
(Continued)

FOREIGN PATENT DOCUMENTS

KR 10-2002-0025842 A 4/2002
KR 10-2009-0037098 A 4/2009
(Continued)

Primary Examiner — Long K Tran
(74) Attorney, Agent, or Firm — Knobbe Martens Olson & Bear LLP

(57) ABSTRACT

An organic light-emitting diode (OLED) display is disclosed. In one aspect, the display includes a substrate, a switching transistor formed over the substrate, a driving transistor electrically connected to the switching transistor, and a pixel electrode electrically connected to the driving transistor. The display also includes a pixel definition layer covering the pixel electrode and having a pixel opening, an organic emission layer formed only in the pixel opening and connected to the pixel electrode, and a common electrode formed over the organic emission layer. The pixel definition layer is formed over the driving transistor.

19 Claims, 6 Drawing Sheets

(51) Int. Cl.
     *G09G 3/3266*   (2016.01)
     *G09G 3/3225*   (2016.01)
     *G09G 3/3275*   (2016.01)
     *G09G 3/20*     (2006.01)
     *G09G 3/3233*   (2016.01)

(52) U.S. Cl.
     CPC ... *G09G 2310/08* (2013.01); *G09G 2330/028* (2013.01); *G09G 2330/045* (2013.01)

(56) References Cited

U.S. PATENT DOCUMENTS

| | | | | |
|---|---|---|---|---|
| 2012/0105605 | A1* | 5/2012 | Nam | G09G 3/003 |
| | | | | 348/51 |
| 2014/0118232 | A1* | 5/2014 | Kim | H01L 27/124 |
| | | | | 345/82 |
| 2014/0197382 | A1* | 7/2014 | Kim | H01L 29/45 |
| | | | | 257/40 |
| 2014/0240366 | A1* | 8/2014 | Lee | G09G 3/2033 |
| | | | | 345/690 |
| 2015/0001483 | A1* | 1/2015 | Namkung | H01L 27/3244 |
| | | | | 257/40 |
| 2015/0015468 | A1* | 1/2015 | Ko | G09G 3/3233 |
| | | | | 345/82 |

FOREIGN PATENT DOCUMENTS

| | | |
|---|---|---|
| KR | 10-2012-0094761 A | 8/2012 |
| KR | 10-2014-0048225 A | 4/2014 |
| KR | 10-2014-0062369 A | 5/2014 |

* cited by examiner

ORGANIC LIGHT-EMITTING DIODE DISPLAY

INCORPORATION BY REFERENCE TO ANY PRIORITY APPLICATIONS

This application claims priority to and the benefit of Korean Patent Application No. 10-2015-0064617 filed in the Korean Intellectual Property Office on May 8, 2015, the entire contents of which are incorporated herein by reference.

BACKGROUND

Field

The described technology generally relates to an organic light-emitting diode (OLED) display.

Description of the Related Technology

An OLED includes two electrodes and an interposed organic light emitting layer. Electrons injected from a cathode electrode and holes injected from an anode electrode are combined in the organic light emitting layer to form excitons. Light is emitted while the excitons discharge energy.

An OLED display includes a matrix of pixels, each including an OLED as well as transistors and capacitors for driving the OLED.

Two types of driving methods are used. An analog driving method is one in which a current is changed to express gray levels and a digital driving method is one in which emitting time is controlled by a switching operation of a driving transistor to express gray levels. For example, in an OLED display employing the digital driving method, it is critical for a driving transistor inside a pixel to stably implement as many subframes in one frame as possible. Thus, the driving transistor can overheat during driving, thereby degrading the organic emission layer. When the heating of the driving transistor becomes excessive, the organic emission layer can deform.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

One inventive aspect relates an OLED display that can prevent the deformation of the organic emission layer due to the heating of the driving transistor.

Another aspect is an organic light-emitting diode (OLED) display, comprising: a substrate; a switching transistor on the substrate; a driving transistor electrically connected to the switching transistor; a pixel electrode electrically connected to the driving transistor; a pixel definition layer covering the pixel electrode and having a pixel opening; an organic emission layer filling the pixel opening and connected to the pixel electrode; and a common electrode on the organic emission layer, wherein the pixel definition layer cover the driving transistor.

In the above OLED display, the pixel definition layer overlaps the driving transistor in the depth dimension of the OLED display.

In the above OLED display, the driving transistor is positioned outside the pixel opening in the depth dimension of the OLED display.

In the above OLED display, the pixel opening is disposed on the switching transistor.

In the above OLED display, the organic emission layer is separated from the driving transistor in the depth dimension of the OLED display.

The above OLED display further comprises: a scan line on the substrate and transmitting a scan signal; and a data line crossing the scan line and transmitting a data signal; a driving voltage line crossing the scan line and providing a driving voltage, wherein the switching transistor is electrically connected to the scan line and the data line, wherein the switching transistor includes a switching gate electrode electrically connected to the scan line, a switching source electrode including a portion of the data line, and a switching drain electrode facing the switching source electrode, and wherein the driving transistor includes a driving gate electrode electrically connected to the switching drain electrode, a driving source electrode electrically connected to the driving voltage line, and a driving drain electrode facing the driving source electrode.

In the above OLED display, the pixel opening overlaps the switching drain electrode in the depth dimension of the OLED display.

The above OLED display further comprises: an interlayer insulating layer overlapping the scan line in the depth dimension of the OLED display; and a passivation layer overlapping the data line and the driving voltage line in the depth dimension of the OLED display, wherein the pixel definition layer is formed over the passivation layer.

In the above OLED display, the driving gate electrode is disposed on the same layer as the scan line, wherein the driving drain electrode is disposed on the same layer as the data line, and wherein the pixel definition layer overlaps the driving gate electrode, the driving source electrode, and the driving drain electrode in the depth dimension of the OLED display.

In the above OLED display, the pixel electrode overlaps the driving transistor in the depth dimension of the OLED display.

The above OLED display further comprises a digital driver configured to use a digital driving method, wherein the digital driver is further configured to switch the driving transistor so as to control a light emission time of the driving transistor to display a gray scale.

The above OLED display further comprises: a data driver generating a data signal for the switching transistor; a scan driver generating a scan signal for the switching transistor; and a timing controller controlling the scan driver and data driver.

In the above OLED display, the timing controller includes the digital driver.

In the above OLED display, the data driver or the scan driver includes the digital driver.

In the above OLED display, the pixel opening has a bottom portion disposed between the common electrode and the pixel electrode, wherein the organic emission layer completely fills the bottom portion of the pixel opening.

Another aspect is an organic light emitting diode (OLED) display, comprising: a driving transistor; a pixel electrode electrically connected to the driving transistor; a pixel definition layer on the pixel electrode and having a pixel opening; and an organic emission layer filling the pixel opening and connected to the pixel electrode, wherein the organic emission layer does not overlap the driving transistor in the depth dimension of the OLED display.

The above OLED display further comprises a common electrode covering the organic emission layer and the pixel definition layer.

In the above OLED display, the pixel opening has a bottom portion formed between the common electrode and the pixel electrode, wherein the organic emission layer completely fills the bottom portion of the pixel opening.

The above OLED display further comprises a switching transistor including a switching drain electrode and electrically connected to the driving transistor, wherein the driving transistor includes a driving gate electrode, wherein the organic emission layer is disposed on a contact hole, and wherein the switching drain electrode passes through the contact hole to connect the switching transistor to the driving gate electrode.

In the above OLED display, the organic emission layer comprises top and bottom surfaces respectively contacting the common electrode and the pixel electrode, wherein the pixel definition layer contacts neither of the top and bottom surfaces of the organic emission layer.

According to at least one of the disclosed embodiments, since the pixel definition layer is formed to cover the driving transistor for the organic emission layer to not overlap the driving transistor, the heat generated in the driving transistor is minimized from being transmitted to the organic emission layer, thereby preventing the deformation of the organic emission layer.

DETAILED DESCRIPTION OF CERTAIN INVENTIVE EMBODIMENTS

Figure 1:
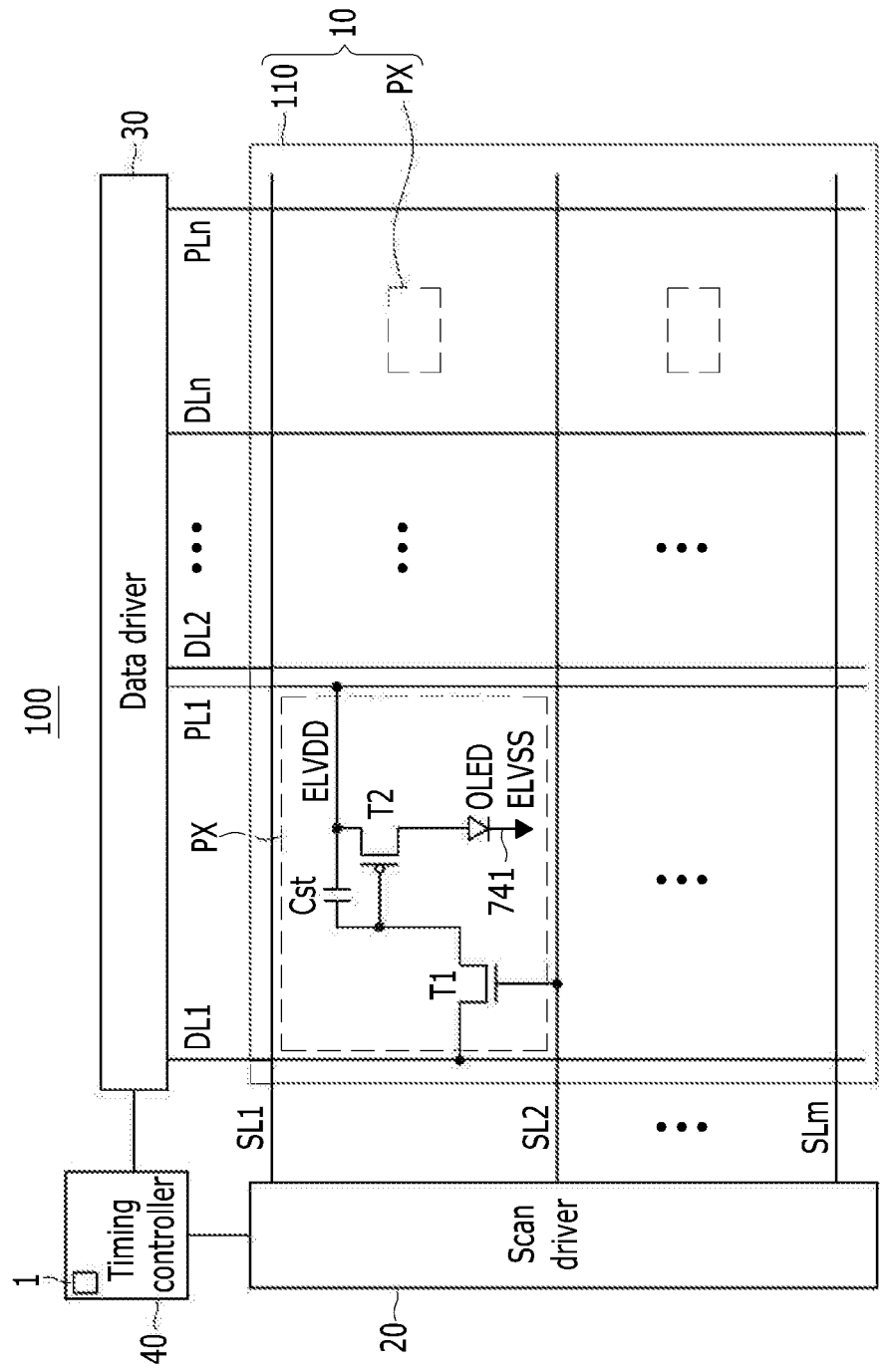
FIG. 1 is a block diagram of an OLED display according to an exemplary embodiment.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

The parts that are unrelated to the description of the exemplary embodiments are not shown for the sake of clarity and focus, and like reference numerals designate like elements throughout the specification.

The size and thickness of the configurations are optionally shown in the drawings for convenience of description, and the present disclosure is not limited to the drawings. In the drawings, the thickness of layers, films, panels, regions, etc., are exaggerated for clarity. In the drawings, the thickness of layers, films, panels, regions, etc., are exaggerated for convenience of description.

In addition, unless explicitly described to the contrary, the word "comprise" and variations such as "comprises" or "comprising" will be understood to imply the inclusion of stated elements but not the exclusion of any other elements. Also, it will be understood that when an element such as a layer, film, region, or substrate is referred to as being "on" another element, it can be directly on the other element or intervening elements may also be present. In addition, "~on" means either positioned on or below a portion of a target or positioned on the upper side based on a gravity direction, throughout the specification.

Further, in the specification, the word "in a plan view" means when an object portion is viewed from the above, and the word "in a cross-section" means when a cross-section taken by vertically cutting an object portion is viewed from the side.

Also, the present disclosure is not limited to a number of thin film transistors (TFT) and capacitors shown in the accompanying drawings, and in the OLED display, each pixel may be provided with a plurality of transistors and at least one capacitor, and may be formed to have various structures by further forming additional wires or omitting existing wires. In this case, the pixel is a minimum unit for displaying an image, and the OLED display displays the image through the plurality of pixels.

Now, the OLED display according to an exemplary embodiment will be described with reference to accompanying drawings.

FIG. 1 is a schematic diagram of an OLED display 100 according to an exemplary embodiment. Depending on embodiments, certain elements may be removed from or additional elements may be added to the OLED display 100 illustrated in FIG. 1. Furthermore, two or more elements may be combined into a single element, or a single element may be realized as multiple elements. This also applies to the remaining disclosed embodiments.

As shown in FIG. 1, the OLED display 1 includes an display panel 10, a scan driver 20, a data driver 30, and a timing controller 40.

The display panel 10 includes a substrate 110 and a plurality of pixels PX formed on the substrate 110. A plurality of scan lines SL1 to SLm, a plurality of data lines DL1 to DLn, and a plurality of driving voltage lines PL1 to PLn are respectively connected to the pixels PX. The scan lines SL1 to SLm substantially extend in a row direction and are substantially parallel to each other, and the data lines DL1 to DLn and the driving voltage lines PL1 to PLn substantially extend in a column direction and are substantially parallel to each other.

Each pixel PX includes a switching transistor T1 that is respectively coupled to the scan lines SL1 to SLm and the data lines DL1 to DLn, a storage capacitor Cst and a driving transistor T2 that are respectively coupled between the switching transistors T1 and the driving voltage lines PL1 to PLn, and an OLED that is coupled to the driving transistor T2.

The scan driver 20 applies a scan signal to the scan lines SL1 to SLm, and the data driver 30 applies a data signal to the data lines DL1 to DLn.

The switching transistor T1 includes a control terminal, an input terminal, and an output terminal such that the control terminal is coupled to the scan lines SL1 to SLm, the input terminal is coupled to the data lines DL1 to DLn, and the output terminal is coupled to the driving transistor T2. In response to the scan signal applied to the scan lines SL1 to SLm, the switching transistor T1 transmits the data signal applied to the data lines DL1 to DLn to the driving transistor T2.

The driving transistor T2 also includes a control terminal, an input terminal, and an output terminal such that the control terminal is coupled to the switching transistor T1, the input terminal is coupled to the driving voltage lines PL1 to PLn, and the output terminal is coupled to the OLED.

The OLED has an anode connected to the output terminal of the driving transistor T2 and a cathode connected to a common voltage line 741 transmitting a common voltage ELVSS.

When the switching transistor T1 is turned on according to the scan signal, the data signal is charged to the storage capacitor Cst and the control terminal of the driving transistor T2, and as a result, the driving transistor T2 is turned on to apply the driving voltage ELVDD of the driving voltage lines PL1 to PLn to the OLED, thereby allowing the OLED to emit light.

The timing controller 40 receives image signals and various control signals from an external system (not shown), and generates RGB signals, a data control signal, and a scan control signal to transmit them to the scan driver 20 and the data driver 30.

Figure 2:
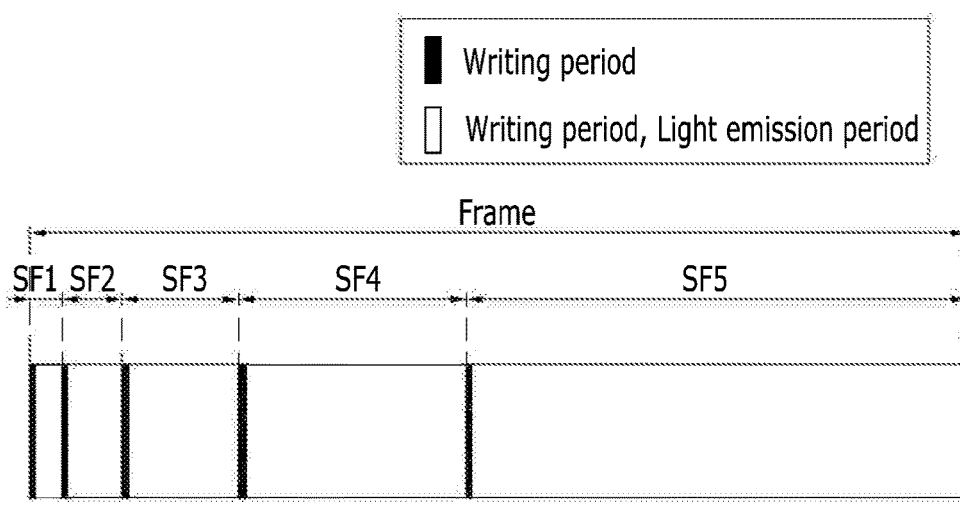
FIG. 2 is a view to explain a digital driving method of an OLED display according to an exemplary embodiment.

FIG. 2 is a drawing for describing a digital driving method of the OLED display according to the exemplary embodiment.

As shown in FIG. 2, in the digital driving method, gray levels of the image are displayed for each frame that include a plurality of sub-fields.

In this case, each sub-field includes a writing period for inputting the data signal to each pixel and an emitting period for allowing the OLED to actually emit light, and may further include an erasing period for stopping the light emission of the OLED.

For example, when 32 gray levels are used to display the image, one frame is divided into first to fifth sub-fields SF1 to SF5, as shown in FIG. 2, and the first to fifth sub-fields SF1 to SF5 are respectively subdivided into the writing period and the emitting period. In addition, a length of the emitting period may be adjusted to set a binary weight of the corresponding sub-field. For example, a weight value of the first sub-field SF1 is set to $2^0$ and a weight value of the second sub-field SF2 is set to $2^1$, such that the weight value of each sub-field can be determined to be increased in a ratio of $2n$ (n=0, 1, 2, 3, or 4). The frame having such a structure may implement the image with a total of 32 gray levels ($=2^5$). For example, when implementing the image of 32 gray levels, all of the sub-fields from the first sub-field SF1 to the fifth sub-field SF5 are on. For example, 32 gray levels can be displayed by supplying the data signal for turning on the OLED to the data line for the respective writing periods of the first sub-field SF1 to the fifth sub-field SF5 and allowing the OLED to emit light for the respective emitting periods following the respective writing periods. Alternatively, when the image of 10 gray levels is implemented, the second sub-field SF2 having a weight value of 2 ($=2^1$) and the fourth sub-field SF4 having a weight value of 8 ($=2^3$) need to be on. For example, by supplying the data signal for turning on the OLED to the data line for the respective writing periods of the second and fourth sub-fields SF2 and SF4 and the data signal for turning off the OLED to the data line for the respective writing periods of the first, third, and fifth sub-fields SF1, SF3, and SF5, the OLED may be allowed to emit light for the respective emitting periods of the second and fourth sub-fields SF2 and SF4 while not being allowed to emit light for the respective emitting periods of the first, third, and fifth sub-fields SF1, SF3, and SF5, thereby displaying the image at 10 gray levels.

Since the data signal applied to each pixel has two voltage values for turning on or turning off the OLED, such a time-division driving method is referred to as the digital driving method. The digital driver 1 formed to use the digital driving method may be formed in the timing controller 40. However, it is not limited thereto, and the digital driver 1 may be formed in the scan driver 20 or the data driver 30.

In FIG. 2, 5-bit driving in which one frame consists of five sub-fields is exemplarily described, but the number of sub-fields included in one frame can be variously changed. Further, in FIG. 2, an example in which the sub-fields are sequentially arranged in an increasing order of weight values in one frame is illustrated, but the sub-fields may be sequentially arranged in a decreasing order of weight values in one frame or may be arranged irrespective of weight values.

Next, the detailed structure of the OLED display shown in FIGS. 1 and 3 will be described with reference to FIGS. 3, 4, 5, and 6 as well as FIGS. 1 and 2.

Hereinafter, a detailed planar structure of the OLED display according to the exemplary embodiment will be first described in detail with reference to FIGS. 3, 4, and 5, and a detailed cross-sectional structure will be described in detail with reference to FIG. 6.

Figure 3:
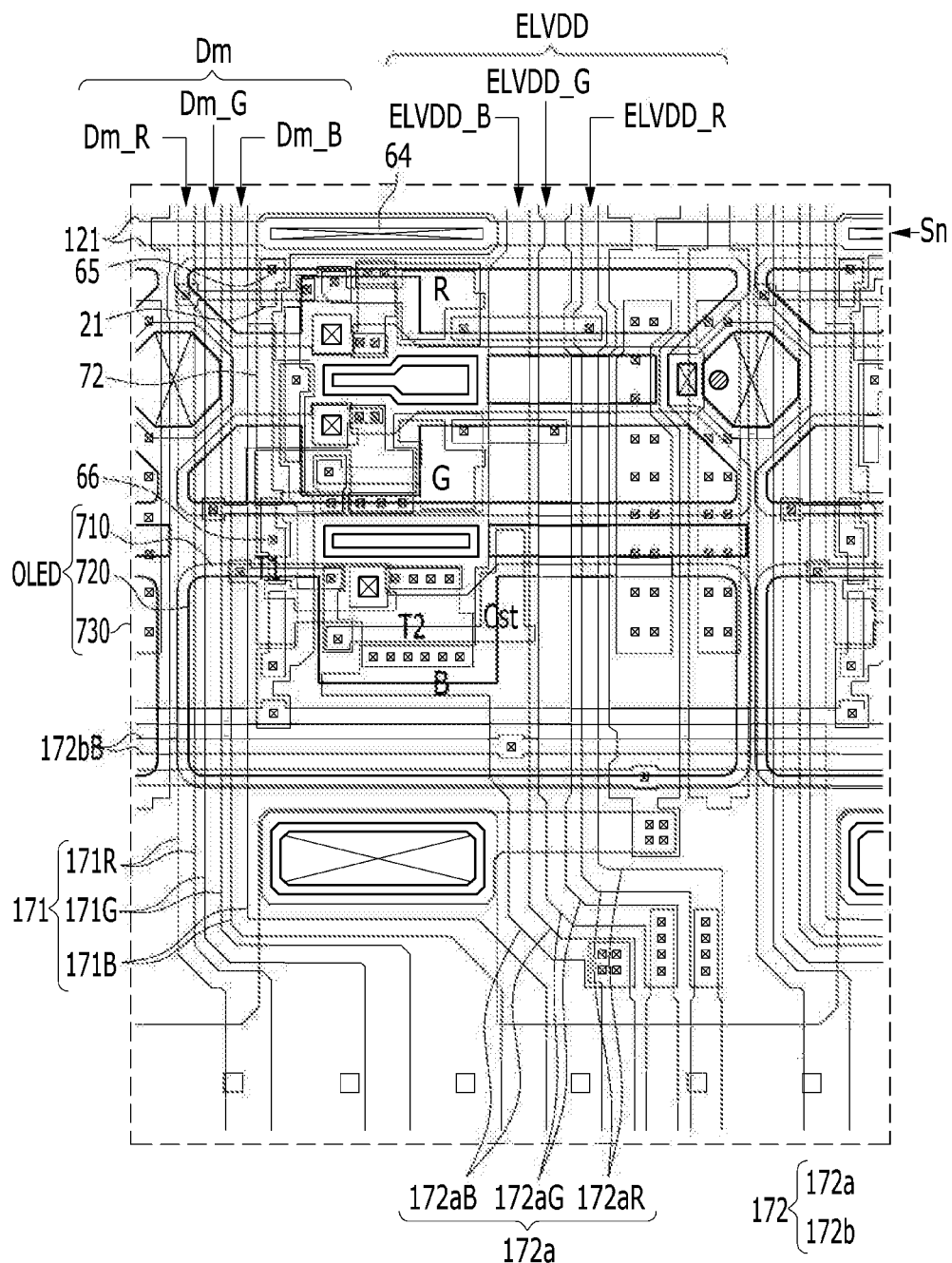
FIG. 3 is a schematic layout view of a transistor and a capacitor of an OLED display according to an exemplary embodiment.

First, as shown in FIG. 3, the pixels PX of the OLED display according to an exemplary embodiment includes a red pixel (R), a green pixel (G), and a blue pixel (B) formed in the column direction. A scan line 121, a data line 171, and a driving voltage line 172 are connected to the pixel PX.

The scan line 121 applies the scan signal Sn to the pixel PX and is formed in the row direction, the data line 171 crosses the scan line 121 and applies the data signal Dm to the pixel PX, and the driving voltage line 172 applies the driving voltage ELVDD to the pixel PX.

The data signal Dm includes a red data signal Dm_R, a green data signal Dm_G, and a blue data signal Dm_B, and the data line 171 includes a red data line 171R transmitting the red data signal Dm_R, a green data line 171G transmitting the green data signal Dm_G, and a blue data line 171B transmitting the blue data signal Dm_B.

The driving voltage ELVDD includes a red driving voltage ELVDD_R, a green driving voltage ELVDD_G, and a blue driving voltage ELVDD_B. The driving voltage line 172 includes a vertical driving voltage line 172a parallel to the data line 171 and a horizontal driving voltage line 172b parallel to the scan line 121. The vertical driving voltage line 172a includes a red vertical driving voltage line 172aR transmitting a red driving voltage ELVDD_R, a green vertical driving voltage line 172aG transmitting the green driving voltage ELVDD_G, and a blue vertical driving voltage line 172aB transmitting the blue driving voltage ELVDD_B. The horizontal driving voltage line 172b includes a red horizontal driving voltage line (not shown) connected to the red vertical driving voltage line 172aR, a green horizontal driving voltage line (not shown) connected to the green vertical driving voltage line 172aG, and a blue horizontal driving voltage line 172bB connected to the blue vertical driving voltage line 172aB.

As described above, the driving voltage line 172 is formed of a mesh structure made of the vertical driving voltage line 172a and the horizontal driving voltage line 172b, thereby minimizing the voltage drop of the driving voltage ELVDD.

Also, each pixel PX includes a switching transistor T1, a driving transistor T2, a storage capacitor Cst, and an OLED.

Next, the detailed structure of one pixel will be described with reference to the blue pixel B.

Figure 4:
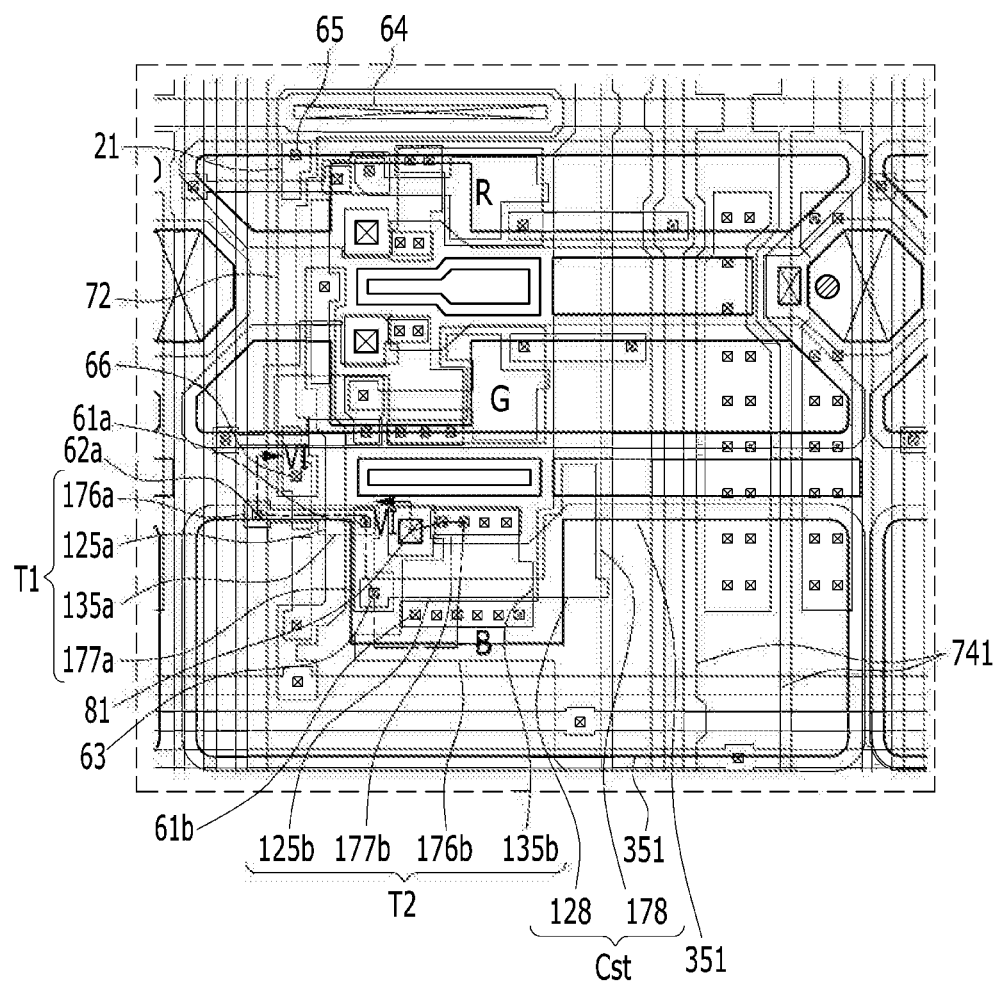
FIG. 4 is a detailed layout view of an OLED display according to an exemplary embodiment.

As shown in FIG. 4, the switching transistor T1 of the blue pixel B includes a switching semiconductor layer 135a, a switching gate electrode 125*a*, a switching source electrode 176*a*, and a switching drain electrode 177*a*. The switching gate electrode 125*a* is connected to the scan line 121 through a first scan connection member 21 and a second scan connection member 72, and the switching source electrode 176*a* is a portion of the blue data line 171B.

The second scan connection member 72 overlaps the scan line 121 and a portion of the first scan connection member 21, and is connected to the scan line 121 through a first connection contact hole 64 and the first scan connection member 21 through a second connection contact hole 65. Also, the second scan connection member 72 partially overlaps the switching gate electrode 125*a* and is connected to the switching gate electrode 125*a* through a third connection contact hole 66.

The driving transistor T2 includes a driving semiconductor layer 135*b*, a driving gate electrode 125*b*, a driving source electrode 176*b*, and a driving drain electrode 177*b*. The driving gate electrode 125*b* is connected to the switching drain electrode 177*a* through a fourth connection contact hole 63. The driving source electrode 176*b* is a portion of the vertical driving voltage line 172*a*, and the driving drain electrode 177*b* is connected to the pixel electrode 710 through a pixel contact hole 81.

The storage capacitor Cst includes a first storage electrode 128 and a second storage electrode 178 overlapping each other. The first storage electrode 128 is a portion extended from the driving gate electrode 125*b*, and the second storage electrode 178 is a portion of the vertical driving voltage line 172*a*. The storage capacitance is determined by a charge charged in the storage capacitor Cst and the voltage between both capacitive plates 128 and 178.

Accordingly, the storage capacitor Cst stores the storage capacitance corresponding to the difference between the driving voltage ELVDD transmitted to the second storage capacitive plate 178 through the driving voltage line 172 and the gate voltage of the driving gate electrode 125*b*.

Next, the detailed cross-sectional structure will be described with reference to FIG. 6.

Figure 6:
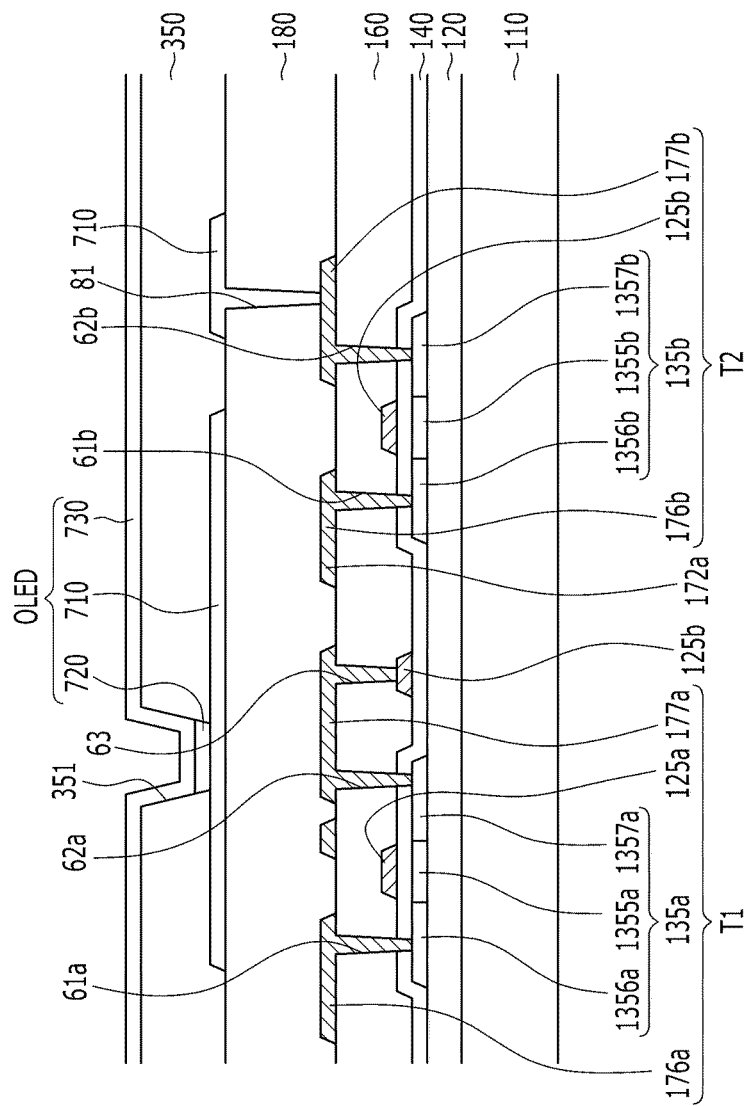
FIG. 6 is a cross-sectional view taken along a line VI-VI of FIG. 4.

As shown in FIG. 6, the substrate 110 of the OLED display according to an exemplary embodiment is an insulating display substrate formed of glass, quartz, ceramic, or plastic.

A buffer layer 120 is disposed on the substrate 110. The buffer layer 120 may be formed to be a single layer of a silicon nitride (SiNx) or a dual layer structure in which a silicon nitride (SiNx) and a silicon oxide (SiOx) are laminated. The buffer layer 120 serves to prevent an unnecessary component such as an impurity or moisture from being permeated and simultaneously planarize a surface.

The switching semiconductor layer 135*a* and the driving semiconductor layer 135*b* are disposed on the buffer layer 120 to be separated from each other.

The semiconductor layers 135*a* and 135*b* may be formed of polysilicon or an oxide semiconductor, and the oxide semiconductor may include one of oxides based on titanium (Ti), hafnium (Hf), zirconium (Zr), aluminum (Al), tantalum (Ta), germanium (Ge), zinc (Zn), gallium (Ga), tin (Sn), or indium (In), and complex oxides thereof such as indium-gallium-zinc oxide (InGaZnO4), indium-zinc oxide (In—Zn—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O). When the semiconductor layers 135*a* and 135*b* are formed of the oxide semiconductor, an additional passivation layer may be added to protect the oxide semiconductor that is vulnerable to an external environment such as high temperature and the like.

The switching semiconductor layer 135*a* is divided into a channel region 1355*a*, and a source region 1356*a* and a drain region 1357*a* respectively disposed at both sides of the channel region 1355*a*. The channel regions 1355*a* of the switching semiconductor layer 135*a* may include polysilicon in which an impurity is not doped, that is, an intrinsic semiconductor, and the source region 1356*a* and the drain region 1357*a* of the switching semiconductor layer 135*a* may include polysilicon in which a conductive impurity is doped, that is, an impurity semiconductor. Similarly, the driving semiconductor layer 135*b* is divided into a channel region 1355*b*, and a source region 1356*b* and a drain region 1357*b* respectively disposed at both sides of the channel region 1355*b*.

However, a doping degree of the semiconductors layer 135*a* and 135*b* is not limited thereto, and the semiconductor layers 135*a* and 135*b* may include the channel region channel-doped with the n-type impurity or the p-type impurity and the source region and the drain region doped with the higher doping concentration than the doping impurity of the channel region.

A gate insulating layer 140 is disposed on the switching semiconductor layer 135*a* and the driving semiconductor layer 135*b*. The gate insulation layer 140 may be a single layer or multiple layers formed of at least one of a silicon nitride and a silicon oxide.

A scan line 121, a switching gate electrode 125*a*, a driving gate electrode 125*b*, a first storage electrode 128, and a first scan connection member 21 are disposed on the gate insulating layer 140.

The scan line 121 extends in the horizontal direction and transmits the scan signal, and the switching gate electrode 125*a* is connected to the scan line 121 through the first scan connection member 21 and the second scan connection member 72 and overlaps the switching semiconductor layer 135*a*. The driving gate electrode 125*b* extends from the first storage capacitive plate 128 to the driving semiconductor layer 135*b*. The switching gate electrode 125*a* and the driving gate electrode 125*b* overlap the channel regions 1355*a* and 1355*b*, respectively.

An interlayer insulating layer 160 is disposed on the scan line 121, the switching gate electrode 125*a*, the driving gate electrode 125*b*, the first storage electrode 128, and the first scan connection member 21. Similarly to the gate insulating layer 140, the interlayer insulating layer 160 may be formed of a silicon nitride or a silicon oxide.

The interlayer insulating layer 160 and the gate insulating layer 140 have source contact holes 61*a* and 61*b* and drain contact holes 62*a* and 62*b* respectively exposing the source regions 1356*a* and 1356*b* and the drain regions 1357*a* and 1357*b*. Also, the interlayer insulating layer 160 has the fourth connection contact hole 63 exposing the driving gate electrode 125*b*.

The data line 171 having a switching source electrode 176a, a vertical driving voltage line 172a having a driving source electrode 176b and a second storage electrode 178, a switching drain electrode 177a connected to the first storage electrode 128, and a driving drain electrode 177b are disposed on the interlayer insulating layer 160. Also, the second scan connection member 72 connecting the first scan connection member 21 and the switching gate electrode 125a to each other is disposed on the interlayer insulating layer 160. The common voltage line 741 transmitting a common voltage ELVSS is disposed on the interlayer insulating layer 160.

The switching source electrode 176a and the driving source electrode 176b are connected to the source regions 1356a and 1356b through the source contact holes 61a and 61b, respectively. The switching drain electrode 177a faces the switching source electrode 176a, and the driving drain electrode 177b faces the driving source electrode 176b. The switching drain electrode 177a and the driving drain electrode 177b are connected to the drain regions 1357a and 1357b through the drain contact holes 62a and 62b, respectively.

The switching drain electrode 177a extends to be electrically connected to the first storage electrode 128 and the driving gate electrode 125b through the fourth connection contact hole 63 disposed in the interlayer insulating layer 160.

The second storage electrode 178 protrudes from the driving voltage line 172 to overlap the first storage electrode 128. Accordingly, the first storage electrode 128 and the second storage electrode 178 form the storage capacitor Cst having the interlayer insulating layer 160 as a dielectric material.

A passivation layer 180 is disposed on the data line 171, the vertical driving voltage line 172a, the switching drain electrode 177a and the driving drain electrode 177b, the second scan connection member 72, and the common voltage line 741. The passivation layer 180 may be formed of a stacked layer of an organic material such as a polyacrylate resin, a polyimide resin, or the like, or a stacked layer of an organic material and an inorganic material. The passivation layer 180 has the pixel contact hole 81 exposing the driving drain electrode 177b.

A pixel electrode 710 is disposed on the passivation layer 180. The pixel electrode 710 may be formed of a transparent conductive material such as indium tin oxide (ITO), indium zinc oxide (IZO), zinc oxide (ZnO), indium oxide (In2O3), etc. The pixel electrode 710 is electrically coupled to the driving drain electrode 177b of the driving transistor T2 through the pixel contact hole 81 disposed in the passivation layer 180, thereby being an anode of the OLED.

A pixel definition layer 350 is disposed on the passivation layer 180 and the edge of the pixel electrode 710. The pixel defined layer 350 may be formed of organic materials such as a polyacrylate resin, a polyimide resin, and the like, and silica-based organic materials.

Figure 5:
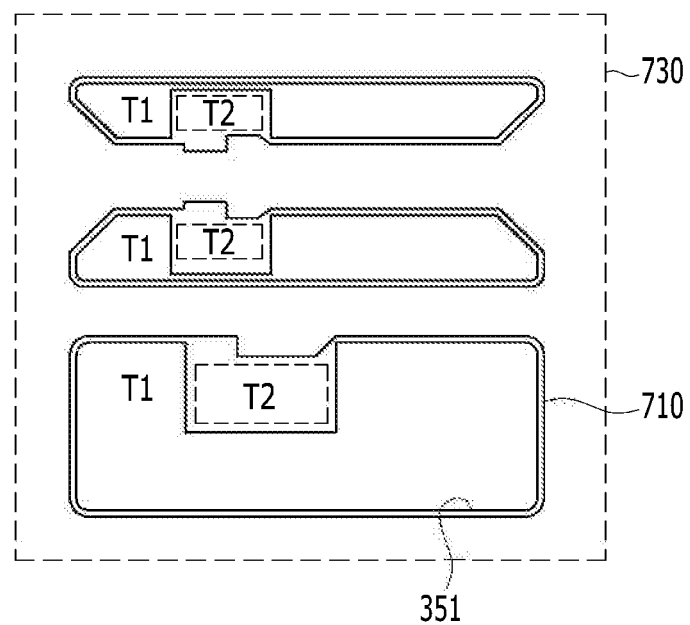
FIG. 5 is a layout view only showing a pixel electrode and a pixel opening shown in FIG. 4.

In FIG. 5, the pixel definition layer 350 has a pixel opening 351 exposing the pixel electrode 710. An organic emission layer 720 is disposed in the pixel opening 351 of the pixel definition layer 350.

The pixel definition layer 350 covers the driving transistor T2, thereby overlapping the driving transistor T2 in a plan view. Accordingly, the driving transistor T2 does not overlap the pixel opening 351 in a plan view. As shown in FIG. 5, the switching transistor T1 and the driving transistor T2 both overlap the pixel electrode 710 in a plan view, the driving transistor T2 is positioned outside the pixel opening 351 in a plan view, and the switching transistor T1 is positioned inside the pixel opening 351 in a plan view.

For example, the driving gate electrode 125b, the driving source electrode 176b, and the driving drain electrode 177b forming the driving transistor T2 do not overlap the pixel opening 351 in a plan view. Accordingly, the driving gate electrode, the driving source electrode, and the driving drain electrode also do not overlap the organic emission layer 720 filled with the pixel opening 351.

As described above, since the organic emission layer 720 does not overlap the driving transistor T2, the heat generated in the driving transistor T2 is minimized to be transmitted to the organic emission layer 720, thereby preventing the deformation of the organic emission layer 720.

The organic emission layer 720 is formed to have multiple layers including one or more of an emission layer, a hole injection layer (HIL), a hole transporting layer (HTL), an electron transporting layer (ETL), and an electron injection layer (EIL). When the organic emission layer 720 includes all of them, the hole-injection layer is disposed on the pixel electrode 710 serving as the anode, and the hole-transporting layer, the emission layer, the electron-transporting layer, and the electron-injection layer may be sequentially laminated thereon.

The organic emission layer 720 may include a red organic emission layer emitting red light, a green organic emission layer emitting green light, and a blue organic emission layer emitting blue light. The red organic emission layer, the green organic emission layer, and the blue organic emission layer are respectively disposed on a red pixel, a green pixel, and a blue pixel to implement a color image.

Further, the red organic emission layer, the green organic emission layer, and the blue organic emission layer are integrally laminated on the organic emission layer 720 together with the red pixel, the green pixel, and the blue pixel to respectively form a red color filter, a green color filter, and a blue color filter in each pixel so as to implement a color image. Alternatively, a white organic emission layer emitting white light is disposed on all of the red pixel, the green pixel, and the blue pixel, and a red color filter, a green color filter, and a blue color filter are respectively formed for every pixel to implement a color image. When the color image is implemented by using the white organic emission layer and the color filter, a deposition mask for depositing the red organic emission layer, the green organic emission layer, and the blue organic emission layer on individual pixels, that is, the red pixel, the green pixel, and the blue pixel, is not required.

The white organic emission layer described in another exemplary embodiment may be formed to have a single organic emission layer, and may further include a configuration in which a plurality of organic emission layers are laminated to emit white light. For example, a configuration in which at least one yellow organic emission layer and at least one blue organic emission layer are combined to emit white light, a configuration in which at least one cyan organic emission layer and at least one red organic emission layer are combined to emit white light, and a configuration in which at least one magenta organic emission layer and at least one green organic emission layer are combined to emit white light may be further included.

A common electrode 730 is disposed on the pixel definition layer 350 and the organic emission layer 720. The common electrode 730 transmits the common voltage ELVSS output through the common voltage line 741. The common electrode 730 may be formed of a transparent conductive material such as indium tin oxide (ITO), indium zinc oxide (IZO), zinc oxide (ZnO), indium oxide (In2O3), etc., or a reflective metal such as lithium, calcium, lithium fluoride/calcium, lithium fluoride/aluminum, aluminum, silver, magnesium, gold, etc. The common electrode 730 becomes the cathode of the OLED. The pixel electrode 710, the organic emission layer 720, and the common electrode 730 form the OLED.

While the inventive technology has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. An organic light-emitting diode (OLED) display, comprising:
   a substrate;
   a switching transistor on the substrate;
   a driving transistor electrically connected to the switching transistor; a pixel electrode electrically connected to the driving transistor; a pixel definition layer covering the pixel electrode and having a pixel opening; an organic emission layer filling the pixel opening and connected to the pixel electrode;
   a common electrode on the organic emission layer: and
   a digital driver configured to use a digital driving method, wherein the digital driver is further configured to switch the driving transistor so as to control a light emission time of the driving transistor to display a gray scale,
   wherein the pixel definition layer covers the driving transistor,
   the switching transistor and the driving transistor overlap the pixel electrode in a plane view,
   the switching transistor overlaps the organic emission layer in a plane view, and
   the driving transistor does not overlap the organic emission layer in a plane view.

2. The OLED display of claim 1, wherein the pixel definition layer overlaps the driving transistor in the depth dimension of the OLED display.

3. The OLED display of claim 2, wherein the driving transistor is positioned outside the pixel opening in the depth dimension of the OLED display.

4. The OLED display of claim 3, wherein the pixel opening is disposed on the switching transistor.

5. The OLED display of claim 2, wherein the organic emission layer is separated from the driving transistor in the depth dimension of the OLED display.

6. The OLED display of claim 2, further comprising:
   a scan line on the substrate and transmitting a scan signal; and
   a data line crossing the scan line and transmitting a data signal;
   a driving voltage line crossing the scan line and providing a driving voltage,
   wherein the switching transistor is electrically connected to the scan line and the data line,
   wherein the switching transistor includes a switching gate electrode electrically connected to the scan line, a switching source electrode including a portion of the data line, and a switching drain electrode facing the switching source electrode, and
   wherein the driving transistor includes a driving gate electrode electrically connected to the switching drain electrode, a driving source electrode electrically connected to the driving voltage line, and a driving drain electrode facing the driving source electrode.

7. The OLED display of claim 6, wherein the pixel opening overlaps the switching drain electrode in the depth dimension of the OLED display.

8. The OLED display of claim 6, further comprising:
   an interlayer insulating layer overlapping the switching gate electrode in the depth dimension of the OLED display; and
   a passivation layer overlapping the switching source electrode in the depth dimension of the OLED display,
   wherein the pixel definition layer is disposed on the passivation layer.

9. The OLED display of claim 7, wherein the driving gate electrode is disposed on the same layer as the switching gate electrode, wherein the driving drain electrode is disposed on the same layer as the switching source electrode, and wherein the pixel definition layer overlaps the driving gate electrode, the driving source electrode, and the driving drain electrode in the depth dimension of the OLED display.

10. The OLED display of claim 9, wherein the pixel electrode overlaps the driving transistor in the depth dimension of the OLED display.

11. The OLED display of claim 1, further comprising:
    a data driver generating a data signal for the switching transistor;
    a scan driver generating a scan signal for the switching transistor; and
    a timing controller controlling the scan driver and data driver.

12. The OLED display of claim 11, wherein the timing controller includes the digital driver.

13. The OLED display of claim 11, wherein the data driver or the scan driver includes the digital driver.

14. The OLED display of claim 11, wherein the pixel opening has a bottom portion disposed between the common electrode and the pixel electrode, and wherein the organic emission layer completely fills the bottom portion of the pixel opening.

15. An organic light emitting diode (OLED) display, comprising:
    a driving transistor;
    a switching transistor connected to the driving transistor;
    a pixel electrode electrically connected to the driving transistor;
    a pixel definition layer on the pixel electrode and having a pixel opening;
    an organic emission layer filling the pixel opening and connected to the pixel electrode; and
    a digital driver configured to use a digital driving method, wherein the digital driver is further configured to switch the driving transistor so as to control a light emission time of the driving transistor to display a gray scale,
    wherein the organic emission layer does not overlap the driving transistor in a plane view,
    the switching transistor and the driving transistor overlap the pixel electrode in a plane view, and
    the switching transistor overlaps the organic emission layer in a plane view.

16. The OLED display of claim 15, further comprising a common electrode covering the organic emission layer and the pixel definition layer.

17. The OLED display of claim 15, wherein the pixel opening has a bottom portion formed between the common electrode and the pixel electrode, and wherein the organic emission layer completely fills the bottom portion of the pixel opening.

18. The OLED display of claim 15, the switching transistor including a switching drain electrode and electrically connected to the driving transistor, wherein the driving transistor includes a driving gate electrode, wherein the organic emission layer is disposed on a contact hole, and wherein the switching drain electrode passes through the contact hole to connect the switching transistor to the driving gate electrode.

19. The OLED display of claim 15, wherein the organic emission layer comprises top and bottom surfaces respectively contacting the common electrode and the pixel electrode, and wherein the pixel definition layer contacts neither of the top and bottom surfaces of the organic emission layer.

* * * * *